United States Patent
Nakano et al.

(10) Patent No.: US 12,341,287 B2
(45) Date of Patent: Jun. 24, 2025

(54) CONNECTOR

(71) Applicant: YAZAKI CORPORATION, Tokyo (JP)

(72) Inventors: Katsuya Nakano, Makinohara (JP); Takashi Sone, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 339 days.

(21) Appl. No.: 18/300,401

(22) Filed: Apr. 14, 2023

(65) Prior Publication Data
US 2023/0378683 A1   Nov. 23, 2023

(30) Foreign Application Priority Data

May 18, 2022   (JP) ................. 2022-081355

(51) Int. Cl.
*H01R 13/502*   (2006.01)
*H01H 85/47*   (2006.01)
*H01R 13/68*   (2011.01)
*H05K 7/20*   (2006.01)

(52) U.S. Cl.
CPC .......... *H01R 13/502* (2013.01); *H01H 85/47* (2013.01); *H01R 13/68* (2013.01); *H05K 7/20436* (2013.01)

(58) Field of Classification Search
CPC ........ H01R 13/502; H01R 13/68; H01R 4/34; H01R 13/533; H01R 13/6581; H01H 85/47; H01H 85/202; H05K 7/20436; H05K 7/2039
See application file for complete search history.

(56) References Cited

U.S. PATENT DOCUMENTS

| | | | | |
|---|---|---|---|---|
| 11,476,615 | B2 * | 10/2022 | Suzuki | H01R 13/5808 |
| 2015/0288090 | A1 * | 10/2015 | Shigeta | H01R 13/5202 |
| | | | | 439/587 |
| 2018/0069349 | A1 * | 3/2018 | Kato | H01H 85/47 |
| 2023/0378683 | A1 * | 11/2023 | Nakano | H05K 7/20436 |

FOREIGN PATENT DOCUMENTS

| | | | | |
|---|---|---|---|---|
| DE | 102017215600 A1 * | 3/2018 | | H01H 85/47 |
| JP | 2013-99071 A | 5/2013 | | |
| JP | 2018-41632 A | 3/2018 | | |

* cited by examiner

*Primary Examiner* — Abdullah A Riyami
*Assistant Examiner* — Nader J Alhawamdeh
(74) *Attorney, Agent, or Firm* — KENEALY VAIDYA LLP

(57) ABSTRACT

A connector includes a casing, a shield shell that accommodates the casing, a wire arranged in the casing, a connector terminal connected to the wire, a blocking member that blocks current by overcurrent flowing in the wire, stud bolts and nuts for connecting the blocking member and the wire, and heat conductive members. The casing includes casing concave parts, which are recessed toward a casing space part and have filling space parts to be filled with the heat conductive members. The stud bolts are fixed to the casing and include exposed surfaces that are partially exposed to the filling space parts. The heat conductive members are in direct contact with the exposed surfaces and a shell inner surface in a filled state.

3 Claims, 6 Drawing Sheets

CONNECTOR

CROSS-REFERENCE TO RELATED APPLICATION(S)

The present application claims priority to and incorporates by reference the entire contents of Japanese Patent Application No. 2022-081355 filed in Japan on May 18, 2022.

BACKGROUND OF THE INVENTION

1. Field of the Invention

The present invention relates to a connector.

2. Description of the Related Art

One of the conventionally known connectors is installed at an end of a wire that supplies power from a power source such as a battery to an on-vehicle device such as an air conditioner, and internally includes a blocking member such as a fuse. Such a connector, for example, needs to dissipate the heat generated from the blocking member. Japanese Patent Application Laid-open No. 2013-99071 discloses a circuit structure including a busbar substrate in which a plurality of busbars are stacked, and a heat dissipation member such as a heat sink. Among the busbars, the busbar for ground connection is disposed in direct contact with the heat dissipation member while the busbars other than the busbar for ground connection are overlapped on the heat dissipation member through an insulating heat conductive member having an insulating property and a heat conductive property. A connector according to Japanese Patent Application Laid-open No. 2018-41632 includes a heat dissipation member that covers a fuse main body inside a casing, and by having a part of the heat dissipation member in contact with the casing, the heat of the fuse is released to the outside.

Incidentally, for only the casing as described in Japanese Patent Application Laid-open No. 2013-99071, the heat can be released by bringing the heat dissipation member in direct contact with the busbar for ground connection that is a heat source; however, for a connector whose casing is entirely covered with a shield shell, the heat needs to be released using the shield shell.

SUMMARY OF THE INVENTION

It is an object of the present invention to provide a connector that can easily release heat generated in a blocking member to the outside through a shield shell.

In order to achieve the above mentioned object, a connector according to one aspect of the present invention includes a casing that has an insulating property and includes a casing space part; a shield shell that includes a shell space part for accommodating the casing; a wire that is partially arranged from outside the shield shell to the casing space part; a connector terminal that is accommodated in the casing space part, electrically connected to the wire in the casing space part, and electrically connected to a counterpart connector terminal in a counterpart connector; a blocking member that is electrically connected between the connector terminal and the wire in the casing space part and blocks current by overcurrent flowing in the wire; a fastening member and a fastened member that electrically connect the blocking member and the wire by bringing the blocking member and the wire in contact with each other in the casing space part; and a heat conductive member that is solid and has an insulating property, wherein the casing includes a concave part that is recessed from an outer surface of the casing toward the casing space part and that includes a filling space part to be internally filled with the heat conductive member, one of the fastening member and the fastened member is a fixing member that is fixed to the casing, the fixing member includes an exposed surface at least a part of which is exposed to the filling space part, and the heat conductive member is in direct contact with the exposed surface and an inner surface of the shield shell in a filled state in which the filling space part is filled with the heat conductive member.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

An embodiment according to the present invention is hereinafter described in detail with reference to the drawings. The present invention is not limited by the following embodiment. That is to say, the component in the embodiment below includes the component that can be easily conceived by a so-called person skilled in the art or that is substantially the same, and various omissions, replacements, and changes can be made within the range not departing from the concept of the present invention.

Embodiment

Figure 1:
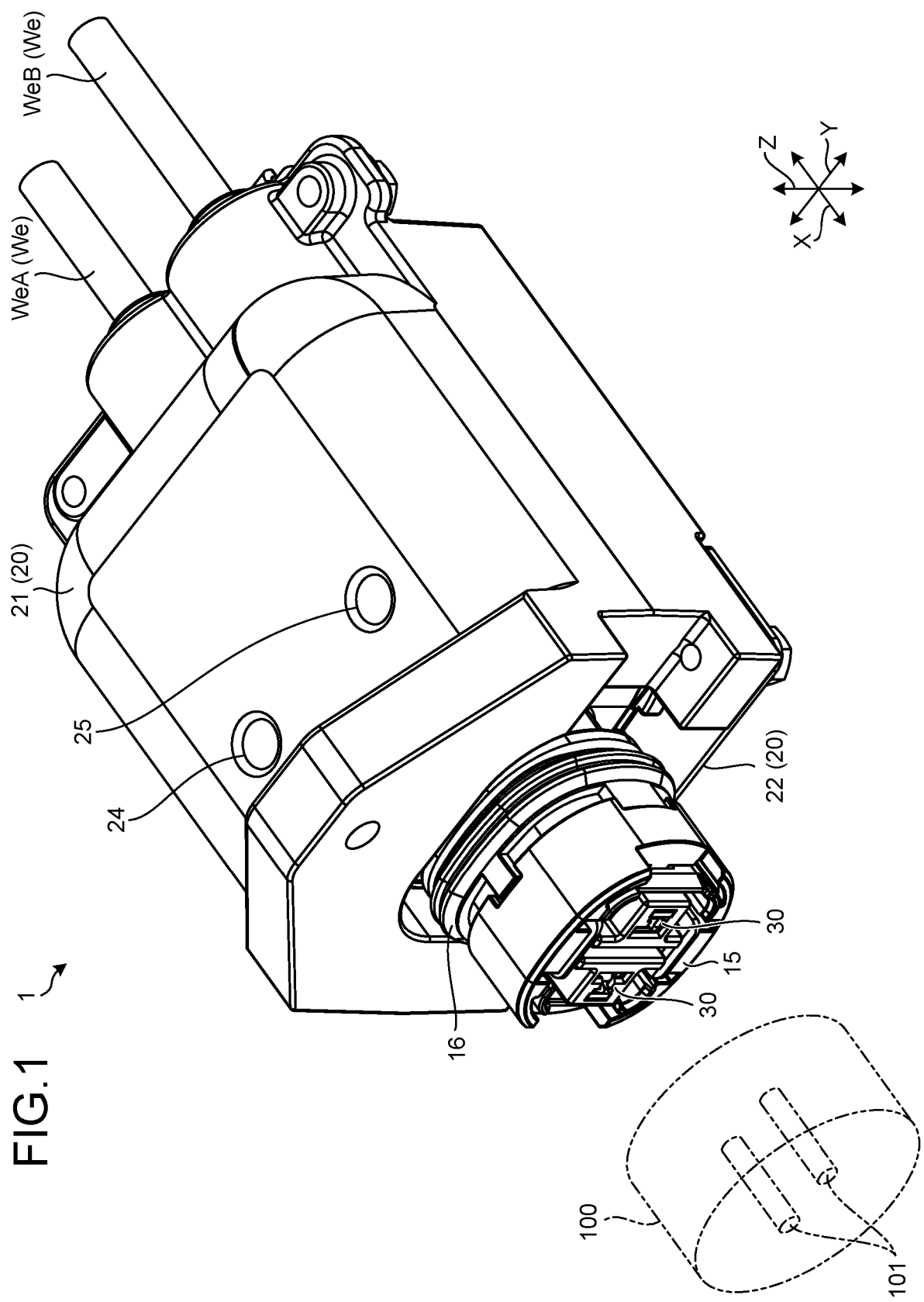
FIG. 1 is a perspective view illustrating a connector according to an embodiment.

A connector 1 according to the present embodiment illustrated in FIG. 1 is a so-called shield connector, and by connecting with a counterpart connector 100, the connector 1 is electrically connected to a counterpart connector terminal 101 in the counterpart connector 100. The counterpart connector 100 is provided, for example, in an on-vehicle device (for example, air conditioner) that is installed in a vehicle such as an automobile and driven by electric power supplied from a power source such as a battery. The connector 1 includes a casing 10, a shield shell 20, a connector terminal 30, a blocking member 40, a wire-side fastening mechanism 81, a terminal-side fastening mechanism 82, and heat conductive members 50 and 51.

In the following description, an X direction in the drawing is a first direction of the connector 1 in the present embodiment. A Y direction is a second direction that is orthogonal to the first direction of the connector 1 in the present embodiment. A Z direction is a third direction that is orthogonal to the first direction and the second direction of the connector 1 in the present embodiment. The first direction is, for example, a direction in which the connector 1 is inserted and extracted and also a direction where the connector 1 extends. The second direction is, for example, a width direction of the connector 1. The third direction is, for example, an up-down direction of the connector 1. The first direction, the second direction, and the third direction are orthogonal to each other. The first direction, the second direction, and the third direction are not limited to a vertical direction or a horizontal direction orthogonal to the vertical direction.

Figure 2:
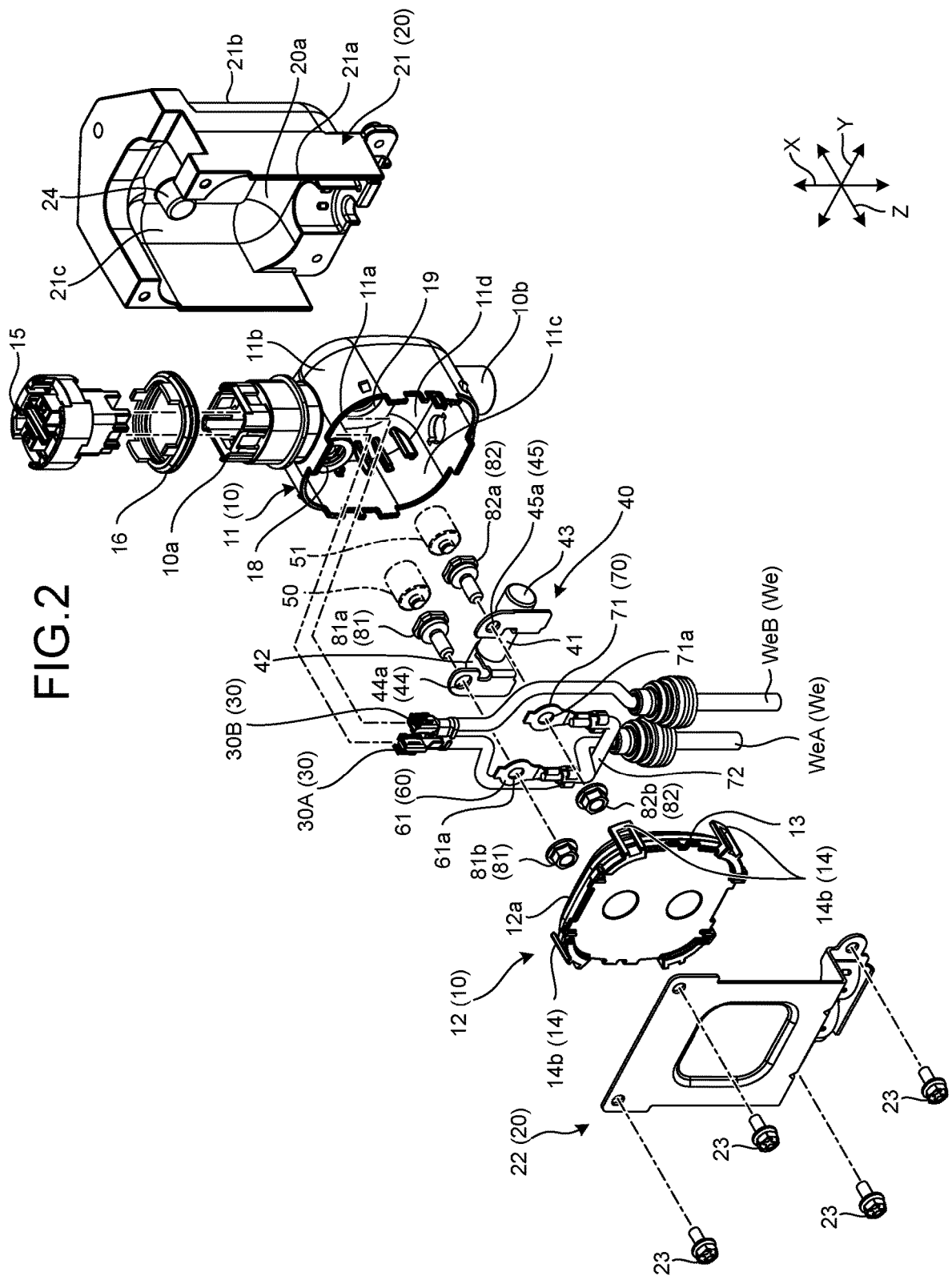
FIG. 2 is an exploded perspective view of the connector according to the embodiment.
Figure 3:
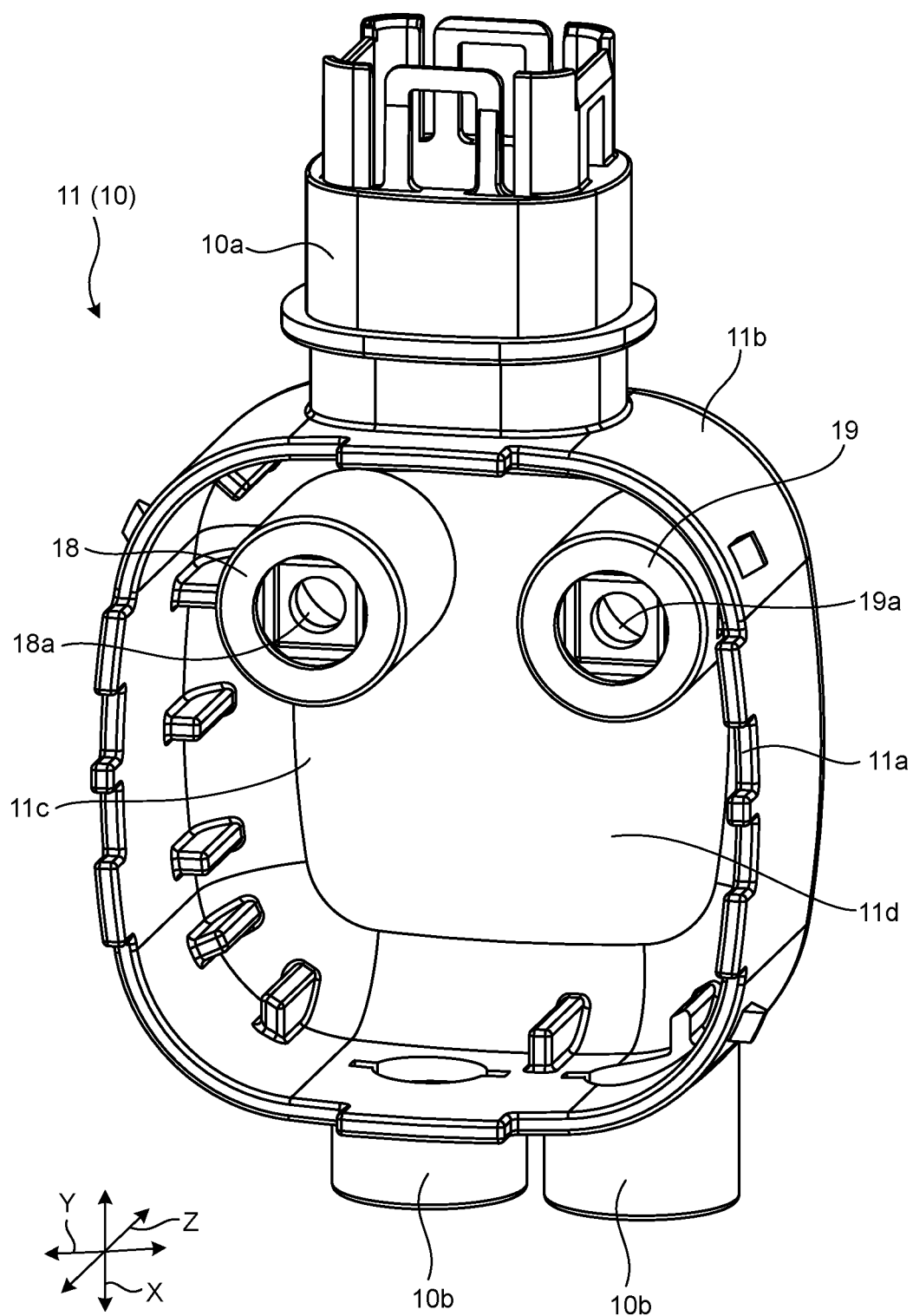
FIG. 3 is a perspective view of a casing in the embodiment.

The casing 10 includes a casing space part 11*d*, and the casing space part 11*d* accommodates an electrical connection part between the connector terminal 30 and a wire We. The casing 10 is molded from an insulating material such as synthetic resin. The casing 10 includes a tubular part 10*a* at one device-side end part in the first direction. The tubular part 10*a* is assembled with a fitting part 15 that is fitted to the counterpart connector 100. The tubular part 10*a* is formed in a tubular shape of protruding from the casing 10 and having one end part in the first direction open, and is positioned so that the opening faces the counterpart connector 100. The fitting part 15 accommodates the connector terminal 30 inside in a state of being assembled to the tubular part 10*a*, and electrically connects the connector terminal 30 to the counterpart connector terminal 101 upon fitting of the fitting part 15 and the counterpart connector 100. An annular gasket 16 is disposed on an outer peripheral surface of the tubular part 10*a* to ensure liquid tightness between the tubular part 10*a* and the counterpart connector 100. By the fitting of the fitting part 15 and the counterpart connector 100, the gasket 16 also adheres to an inner peripheral surface of the counterpart connector 100 and seals the annular space between the inner peripheral surface of the counterpart connector 100 and the outer peripheral surface of the tubular part 10*a*. The casing 10 includes two tubular wire extraction parts 10*b* that make the casing space part 11*d* communicate with the outside (FIG. 1 and FIG. 3). The wire We is partially arranged from outside the shield shell 20 to the casing space part 11*d* through the wire extraction part 10*b*. The wire extraction part 10*b* is provided for each connector terminal 30. The casing 10 has a split structure divided into a plurality of casing members, which are assembled together to form a box body. The casing 10 includes a housing 11 as a first casing member and a cover 12 as a second casing member (FIG. 1 to FIG. 3).

The housing 11 includes an opening 11*a* at one end part in the third direction, and the casing space part 11*d* is formed on the inside. The housing 11 accommodates the connector terminals 30, the wires We, the blocking member 40, the heat conductive members 50 and 51, and the like through the opening 11*a*. The housing 11 includes the tubular part 10*a* protruding from the device-side end part in the first direction and the wire extraction parts 10*b* protruding from the wire-side end part on the other side in the first direction. The housing 11 includes casing concave parts 18 and 19 that are recessed from a housing outer surface 11*b* of the housing 11 toward the casing space part 11*d* as illustrated in FIG. 3 to FIG. 6. The casing concave parts 18 and 19 are arranged in the second direction, extend in the third direction, and have the same depth. The casing concave parts 18 and 19 have a circular shape when viewed from the third direction. The casing concave parts 18 and 19 have filling space parts 18*c* and 19*c* to be internally filled with the heat conductive members 50 and 51. The casing concave parts 18 and 19 have penetration holes 18*a* and 19*a* that penetrate the bottom of the casing concave parts 18 and 19 and that make the filling space parts 18*c* and 19*c* communicate with the casing space part 11*d*. The penetration holes 18*a* and 19*a* have a circular shape when viewed from the third direction as illustrated in FIG. 3. The penetration holes 18*a* and 19*a* penetrate without sloping along the third direction from the housing outer surface 11*b* to a housing inner surface 11*c* as illustrated in FIG. 5.

The cover 12 is provided to close the opening 11*a* of the housing 11. The cover 12 is fitted to the housing 11 by having an opening 12*a* side inserted into the casing space part 11*d* through the opening 11*a* of the housing 11. An annular gasket 13 is placed between the housing 11 and the cover 12 to ensure liquid tightness therebetween. The gasket 13 is attached to an outer peripheral surface of the cover 12, and when the housing 11 and the cover 12 are fitted together, the gasket 13 also adheres to an inner peripheral surface of the housing 11 and seals the annular space between the inner peripheral surface of the housing 11 and the outer peripheral surface of the cover 12. The housing 11 and the cover 12 have locking structures 14 at a plurality of positions (four positions in this example) to keep the housing 11 and the cover 12 fitted to each other (FIG. 2). The locking structure 14 includes a first engagement part 14*a* on the housing 11 and a second engagement part 14*b* on the cover 12, which are engaged with each other to keep the housing 11 and the cover 12 fitted to each other. The locking structure 14 is formed by, for example, a protrusion with a claw shape, and a stopper (a piece including a penetration hole or a groove) to which this protrusion is inserted, the stopper being configured to stop the movement of the protrusion to a direction opposite to the fitting direction between the housing 11 and the cover 12 (third direction). In the present embodiment, the claw-shaped protrusion as the first engagement part 14*a* protrudes from the outer peripheral surface of the housing 11. As the second engagement part 14*b*, the stopper is provided with a space from the outer peripheral surface of the cover 12.

The shield shell 20 has a shell space part 20*a* that accommodates the casing 10. The shield shell 20 is molded from a conductive material such as metal and suppresses noise penetration to the connector terminals 30 and the wires We on the inside. The shield shell 20 has a split structure divided into a plurality of shell members, which are assembled together to form the box body. The shield shell 20 includes a first shell member 21 and a second shell member 22 (FIG. 1 to FIG. 3).

The first shell member 21 has an opening 21*a* at one end part in the third direction, and the shell space part 20*a* is formed on the inside. The first shell member 21 accommodates the casing 10 through the opening 21*a*. The first shell member 21 includes shell convex parts 24 and 25 protruding from a shell inner surface 21*c* toward the shell space part 20*a* as illustrated in FIG. 1, FIG. 2, and FIG. 4 to FIG. 6. The first shell member 21 includes shell concave parts 24*c* and 25*c* that are recessed from a shell outer surface 21*b* toward the shell space part 20*a*. The shell concave part 24*c* is formed corresponding to the shell convex part 24, and the shell concave part 25*c* is formed corresponding to the shell convex part 25. Regarding the bottom of the shell concave parts 24*c* and 25*c*, which constitutes a part of the shell outer surface 21*b*, the distance between the bottom and the heat conductive members 50 and 51 filling the filling space parts 18*c* and 19*c* is shorter than the distance between the shell outer surface 21*b* except the bottom and the heat conductive members 50 and 51. The shell convex parts 24 and 25 are arranged in the second direction, extend in the third direction, and have the same height in a manner similar to the casing concave parts 18 and 19 of the housing 11. The shell convex parts 24 and 25 have a circular shape when viewed from the third direction. The shell convex parts 24 and 25 are inserted into the casing concave parts 18 and 19 of the housing 11 in the fully accommodated state in which the casing 10 is fully accommodated in the shell space part 20a. Specifically, the shell convex part 24 is inserted into the casing concave part 18 and the shell convex part 25 is inserted into the casing concave part 19. In the fully accommodated state, a gap S is formed between an outer peripheral surface 24b of the shell convex part 24 and an inner peripheral surface 18b of the casing concave part 18, and between an outer peripheral surface 25b of the shell convex part 25 and an inner peripheral surface 19b of the casing concave part 19. These gaps S constitute a part of the filling space parts 18c and 19c. In the fully accommodated state, the outer peripheral surface 24b of the shell convex part 24 faces the inner peripheral surface 18b of the casing concave part 18 through a part of the filling space part 18c. Similarly, in the fully accommodated state, the outer peripheral surface 25b of the shell convex part 25 faces the inner peripheral surface 19b of the casing concave part 19 through a part of the filling space part 19c.

The second shell member 22 is mainly formed by a flat plate that closes the opening 21a of the first shell member 21. The second shell member 22 is provided to close the opening 21a of the first shell member 21 in which the casing 10 is accommodated. The first shell member 21 and the second shell member 22 are joined to each other, for example, by threaded members 23.

The connector terminal 30 is molded into a predetermined shape from a conductive material such as metal. In the present embodiment, the connector terminal 30 of the connector 1 is molded as a female terminal and the counterpart connector terminal 101 is molded as a male terminal. The connector terminal 30 and the counterpart connector terminal 101 may be either female or male, as long as they are fitted together in physical and electrical connection. In the present embodiment, two connector terminals 30 are provided. One of the two connector terminals 30 is referred to as a first connector terminal 30A and the other as a second connector terminal 30B. With respect to the wires We, the wire that is electrically connected to the first connector terminal 30A is referred to as a first wire WeA, and the wire that is electrically connected to the second connector terminal 30B is referred to as a second wire WeB. In the connector 1 according to the present embodiment, the first connector terminal 30A and the first wire WeA are electrically connected directly through the blocking member 40, while the second connector terminal 30B and the second wire WeB are electrically connected directly. For example, the second connector terminal 30B is physically and electrically connected to a core wire at an end of the second wire WeB in a predetermined connection mode such as crimping or welding.

Figure 4:
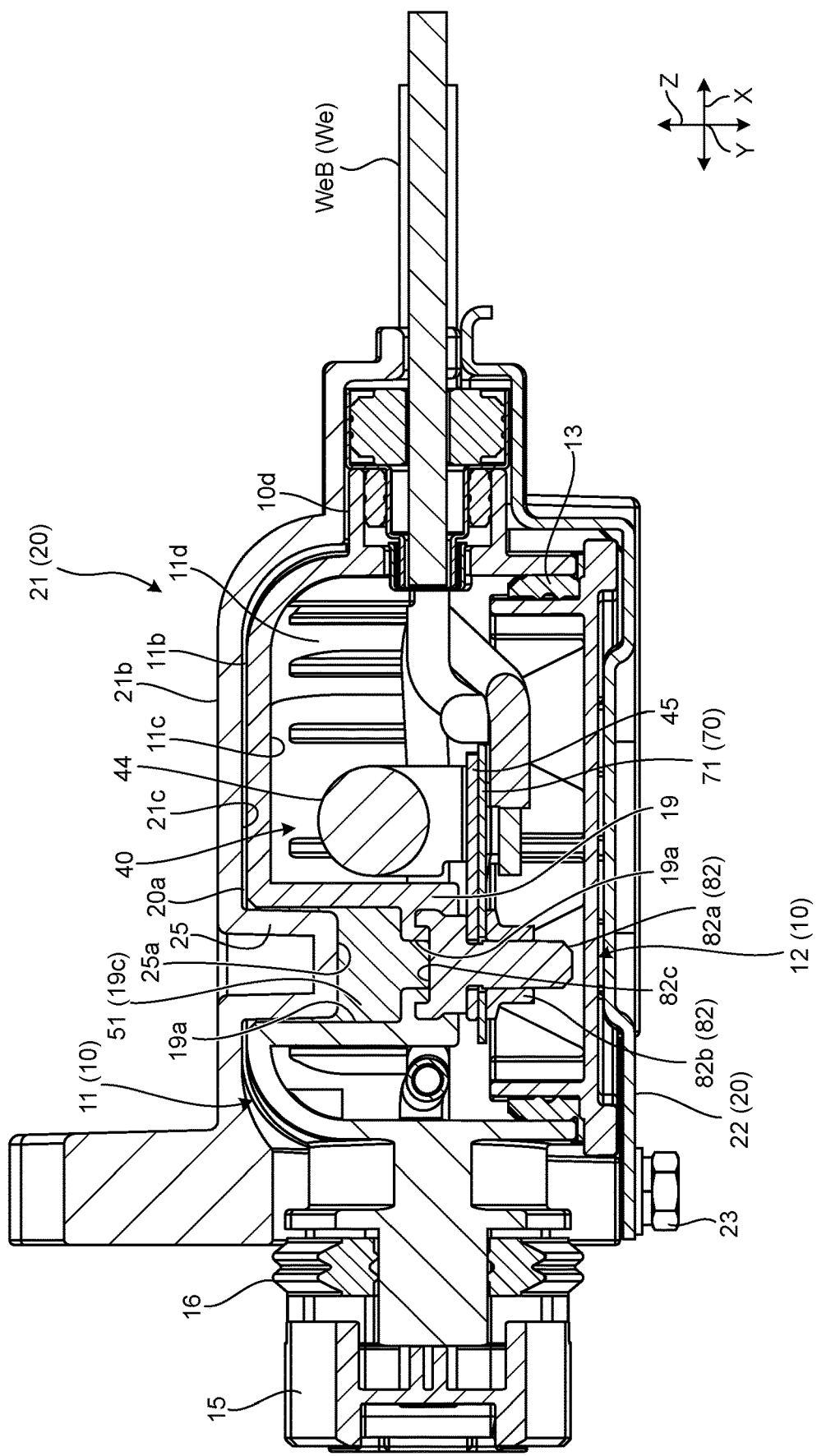
FIG. 4 is a first-sectional view of the connector according to the embodiment.
Figure 5:
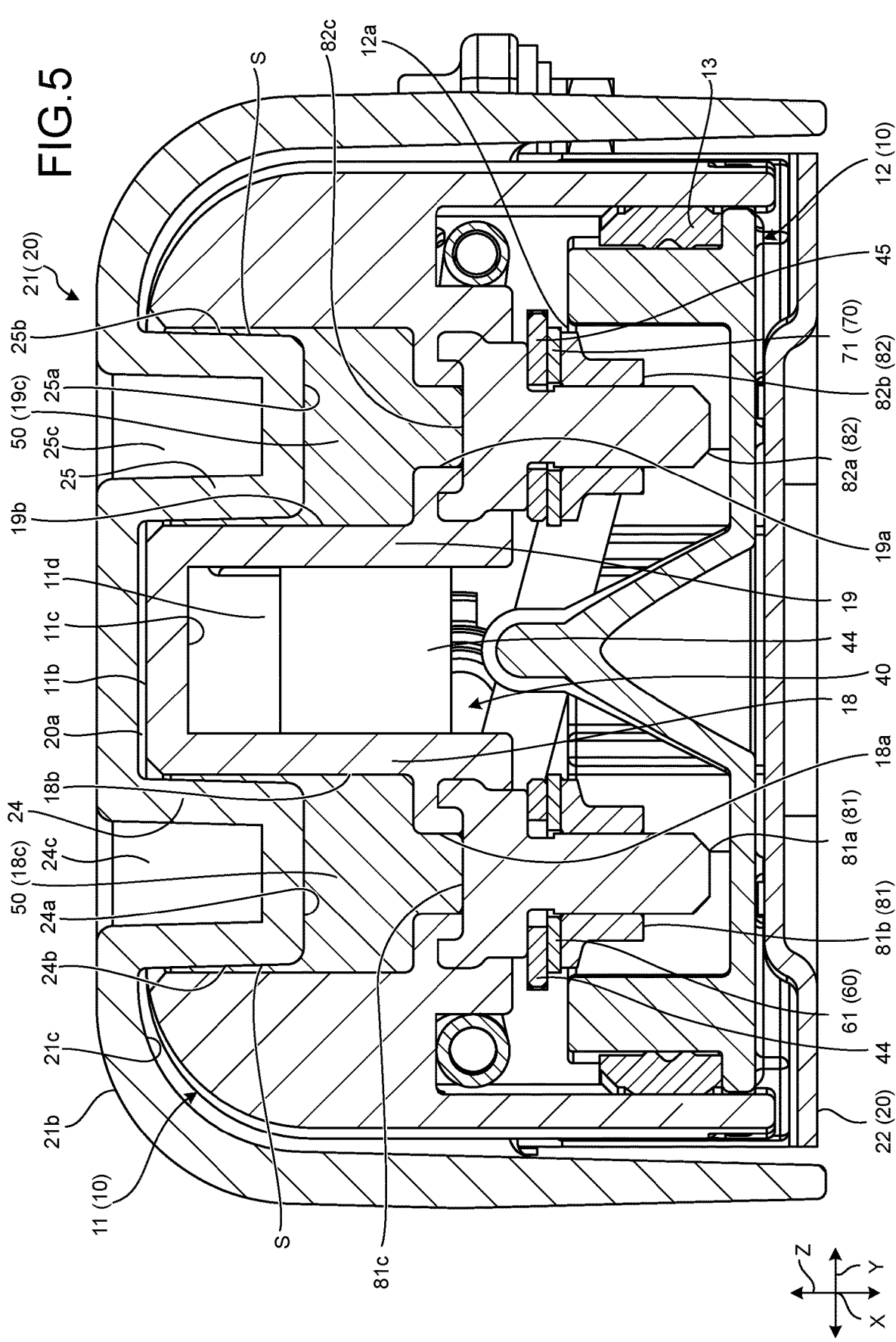
FIG. 5 is a second-sectional view of the connector according to the embodiment.

The blocking member 40 is accommodated in the casing space part 11d as illustrated in FIG. 2, FIG. 4, and FIG. 5. The blocking member 40 is electrically connected between the connector terminal 30 and the wire We in the casing space part 11d and blocks current by overcurrent flowing in the wire We. The blocking member 40 is electrically connected between the first connector terminal 30A and the first wire WeA. A fuse is used as the blocking member 40. The blocking member 40 includes a main body part 41 including a fuse element (not illustrated) that is fused by overcurrent, a first conductor part 42 that is electrically connected to one end of the main body part 41 (one end on a conductive path) and electrically connected to the first wire WeA side, and a second conductor part 43 that is electrically connected to the other end of the main body part 41 (the other end on the conductive path) and electrically connected to the first connector terminal 30A side (FIG. 2). The main body part 41 includes a cylindrical container molded from an insulating material with light transmittance, and a fuse element disposed inside the container. The first conductor part 42 and the second conductor part 43 are cylindrically molded from a conductive material such as metal, and one is located at one end of the main body part 41 and the other is located at the other end of the main body part 41. The first conductor part 42 and the second conductor part 43 are arranged along a direction where the connector terminals 30 are arranged.

The blocking member 40 further includes a first coupling part 44 electrically connected to the first conductor part 42 and a first coupling conductor 60, and a second coupling part 45 electrically connected to the second conductor part 43 and a second coupling conductor 70 (FIG. 2).

The first coupling conductor 60 is physically and electrically connected to the first wire WeA and the first conductor part 42, and by this connection, the first wire WeA and the second conductor part 43 are electrically connected to each other. The first coupling conductor 60 is a round terminal 61 molded from a conductive material such as metal, which is physically and electrically connected to a core wire at an end of the first wire WeA (FIG. 2). The connection can be made in a predetermined connection mode such as crimping or welding.

The second coupling conductor 70 is physically and electrically connected to the first connector terminal 30A and the second conductor part 43, and by this connection, the first connector terminal 30A and the second conductor part 43 are electrically connected to each other. The second coupling conductor 70 includes a round terminal 71 molded from a conductive material such as metal and a coupling wire 72 that electrically connects the round terminal 71 to the first connector terminal 30A (FIG. 2). The coupling wire 72 has one end of the core wire physically and electrically connected to the first connector terminal 30A and the other end of the core wire physically and electrically connected to the round terminal 71. The connection can be made in a predetermined connection mode such as crimping or welding.

The first coupling part 44 is a plate-shaped member formed protruding from the first conductor part 42 and having a penetration hole 44a that penetrates in a plate thickness direction. The penetration hole 44a is concentric with a penetration hole 61a of the round terminal 61, and the wire-side fastening mechanism 81 co-tightens and secures the first coupling part 44 and the round terminal 61. The wire-side fastening mechanism 81 electrically connects the blocking member 40 and the wire We by bringing the blocking member 40 and the wire We into contact with each other within the casing space part 11d.

The wire-side fastening mechanism 81 includes a stud bolt 81a, which is a fixing member to be fixed to the housing 11, and a nut 81b that is screwed with the stud bolt 81a. The first coupling part 44 and the round terminal 61 are co-tightened and secured in a manner that the stud bolt 81a, which is the fastened member, is inserted into the respective penetration holes 44a and 61a and the nut 81b, which is the fastening member, is screwed with the stud bolt 81a protruding from the penetration holes 44a and 61a. The first coupling conductor 60 and the first coupling part 44 are coupled by the wire-side fastening mechanism 81.

The stud bolt 81a has an exposed surface 81c that is partially exposed to the filling space part 18c while the stud bolt 81a is fixed to the housing 11 as illustrated in FIG. 5. The exposed surface 81c is a flat surface and is provided on a head part on the opposite side of a shaft part of the stud bolt 81a. The head part of the stud bolt 81a is at least partially embedded and fixed in the housing 11. The exposed surface 81c is exposed to the filling space part 18c through the penetration hole 18a. The shape and size of the exposed surface 81c are determined by the shape and size when the penetration hole 18a is viewed from the third direction.

The second coupling part 45 is a plate-shaped member formed protruding from the second conductor part 43 and having a penetration hole 45a that penetrates in a plate thickness direction. The penetration hole 45a is concentric with a penetration hole 71a of the round terminal 71, and the terminal-side fastening mechanism 82 co-tightens and secures the second coupling part 45 and the round terminal 71. The terminal-side fastening mechanism 82 electrically connects the blocking member 40 and the wire We by bringing the blocking member 40 and the wire We into contact with each other within the casing space part 11d.

The terminal-side fastening mechanism 82 includes a stud bolt 82a, which is a fixing member to be fixed to the housing 11, and a nut 82b that is screwed with the stud bolt 82a. The second coupling part 45 and the round terminal 71 are co-tightened and secured in a manner that the stud bolt 82a, which is the fastened member, is inserted into the respective penetration holes 45a and 71a and the nut 82b, which is the fastening member, is screwed with the stud bolt 82a protruding from the penetration holes 45a and 71a. The second coupling conductor 70 and the second coupling part 45 are coupled by the terminal-side fastening mechanism 82.

The stud bolt 82a has an exposed surface 82c that is partially exposed to the filling space part 19c while the stud bolt 82a is fixed to the housing 11 as illustrated in FIG. 5. The exposed surface 82c is a flat surface and is provided on a head part on the opposite side of a shaft part of the stud bolt 82a. The head part of the stud bolt 82a is at least partially embedded and fixed in the housing 11. The exposed surface 82c is exposed to the filling space part 19c through the penetration hole 19a. The shape and size of the exposed surface 82c are determined by the shape and size when the penetration hole 19a is viewed from the third direction.

Figure 6:
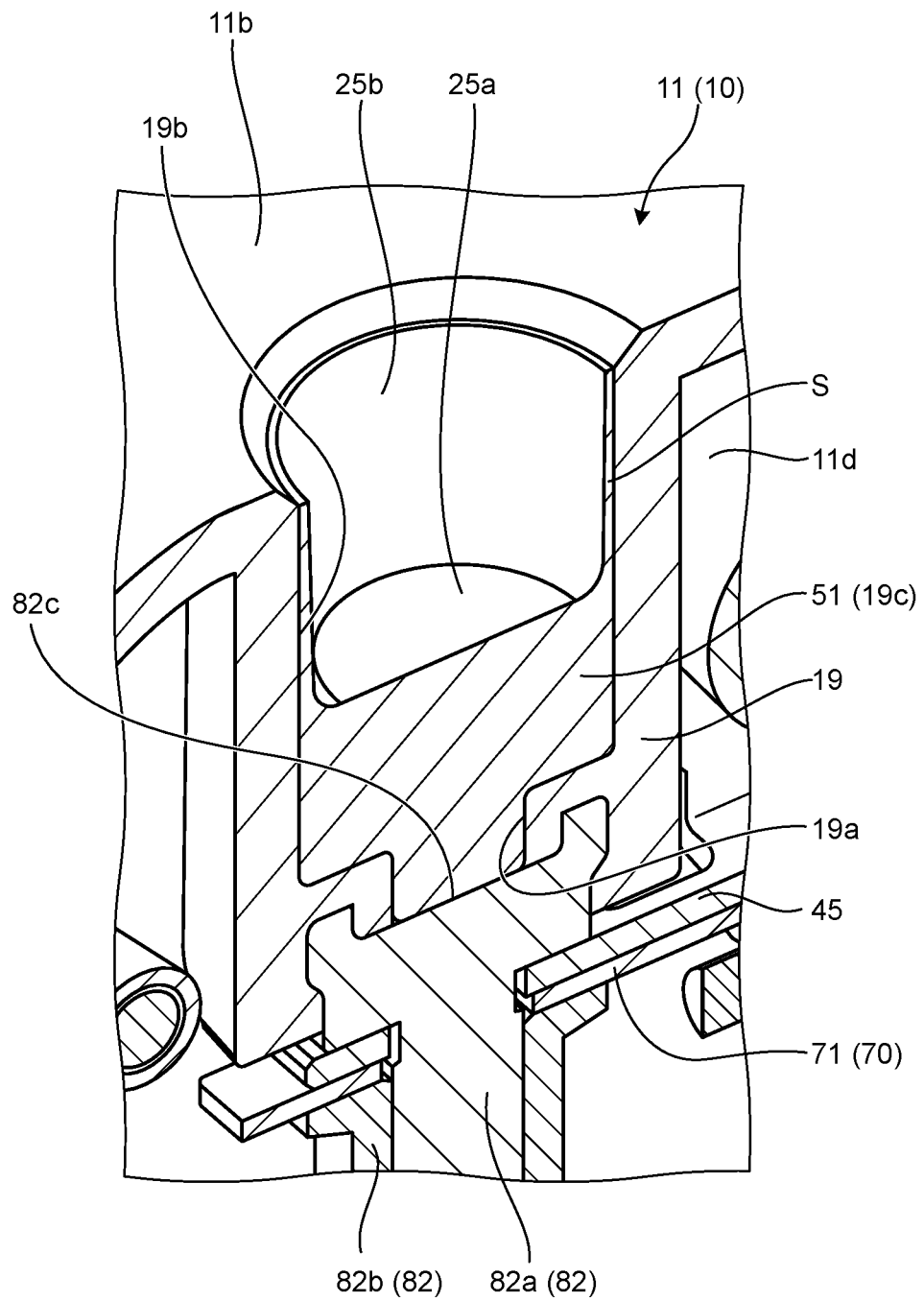
FIG. 6 is a cross-sectional perspective view of a main part of the connector according to the embodiment.

The heat conductive members 50 and 51 include a material with an insulating property and a heat conductive property, and are to fill the filling space parts 18c and 19c. The heat conductive members 50 and 51 are molded from thermosetting silicon, for example. The heat conductive members 50 and 51, for example, fill the filling space parts 18c and 19c in a liquid state before thermal hardening, and harden due to heat transmitted from the blocking member 40, changing in phase from liquid to solid. The heat conductive members 50 and 51 are in direct contact with the exposed surfaces 81c and 82c and the shell inner surface 21c of the shield shell 20 in the filled state in which the filling space parts 18c and 19c are filled with the heat conductive members 50 and 51. The heat conductive members 50 and 51 are in direct contact with the shell convex parts 24 and 25 of the shell inner surface 21c. The distance between the shell inner surface 21c and the shell outer surface 21b (thickness of an end part of the first shell member 21 on the opposite side of the opening 21a in the third direction) is kept substantially constant by the shell concave parts 24c and 25c corresponding to the shell convex parts 24 and 25 even if the shell convex parts 24 and 25 are provided. Therefore, the length in the third direction of the heat conductive members 50 and 51 that fill the filling space parts 18c and 19c (depth in the third direction of the filling space parts 18c and 19c) is shorter than that without the shell concave parts 24c and 25c. The heat conductive members 50 and 51 fill between the exposed surfaces 81c and 82c and top surfaces 24a and 25a of the shell convex parts 24 and 25. Furthermore, the heat conductive members 50 and 51 fill the gaps S formed between the inner peripheral surfaces 18b and 19b of the casing concave parts 18 and 19 and the outer peripheral surfaces 24b and 25b of the shell convex parts 24 and 25 (FIG. 6). The heat conductive member 50 conducts heat between the wire-side fastening mechanism 81 and the shield shell 20. The heat conductive member 51 conducts heat between the terminal-side fastening mechanism 82 and the shield shell 20. The heat conductive members 50 and 51 preferably have higher heat conductivity than the atmosphere (gas layer) and the casing 10.

In the connector 1 in the present embodiment, as the blocking member 40 is energized, the blocking member 40 serves as a heat source. Part of the heat generated by the blocking member 40 conducts to the casing 10 through the gas layer, while the other part conducts directly to the stud bolts 81a and 82a through the first coupling part 44 and the second coupling part 45. The heat having conducted to the stud bolts 81a and 82a, which partially conducts to the housing 11, conducts to the heat conductive members 50 and 51 with higher heat conductivity than the housing 11 through the exposed surfaces 81c and 82c. The heat generated in the first coupling part 44 and the second coupling part 45 also conducts to the nuts 81b and 82b through the first coupling conductor 60 and the second coupling conductor 70. The heat having conducted to the heat conductive members 50 and 51 conducts to the shield shell 20 through the top surfaces 24a and 25a and the outer peripheral surfaces 24b and 25b of the shell convex parts 24 and 25, and is released to the outside through the shield shell 20. Thus, the heat generated in the blocking member 40 can be transferred to the shield shell 20 through the heat conductive members 50 and 51 without passing through the atmosphere (gas layer) between the blocking member 40 and the casing 10 and the atmosphere between the casing 10 and the shield shell 20.

As described above, the connector 1 in the present embodiment includes the connector terminals 30 to be connected to the wires We, the blocking member 40 that blocks current by overcurrent flowing in the wire We, and the stud bolts 81a and 82a and the nuts 81b and 82b for connecting the blocking member 40 and the wires We in the casing space part 11d. The casing 10 includes the casing concave parts 18 and 19, which are recessed from the housing outer surface 11b toward the casing space part 11d and have the filling space parts 18c and 19c to be internally filled with the heat conductive members 50 and 51. The stud bolts 81a and 82a are fixed to the casing 10 and include the exposed surfaces 81c and 82c that are partially exposed to the filling space parts 18c and 19c. The heat conductive members 50 and 51 are in direct contact with the shell inner surface 21c and the exposed surfaces 81c and 82c in the filled state in which the filling space parts 18c and 19c are filled with the heat conductive members 50 and 51.

With the above structure, part of the heat generated in the blocking member 40 is transferred to the heat conductive members 50 and 51 through the stud bolts 81a and 82a, etc., and the heat is released from the heat conductive members 50 and 51 to the outside through the shield shell 20. Thus, as compared to the conventional heat dissipation path in which the heat released to the periphery of the blocking member 40 conducts to the shield shell 20 through the casing 10 and is released to the outside through the shield shell 20, the heat can be released from the shield shell 20 to the outside through the heat conductive members 50 and 51 without passing through the atmosphere (gas layer) between the blocking member 40 and the casing 10 and the atmosphere between the casing 10 and the shield shell 20. In other words, the heat generated in the blocking member 40 can be easily released from the shield shell 20 to the outside without passing through the atmosphere, which has low heat conductivity, and accordingly, the heat generated in the blocking member 40 can be released easily from the shield shell 20 to the outside.

In the connector 1 according to the present embodiment, the shield shell 20 includes the shell convex parts 24 and 25 protruding from the shell inner surface 21c toward the shell space part 20a, and the heat conductive members 50 and 51 are in direct contact with the shell convex parts 24 and 25 of the shell inner surface 21c. Thus, by shortening the distance between the exposed surfaces 81c and 82c and the shield shell 20, the thickness of the heat conductive members 50 and 51 filling between the exposed surfaces 81c and 82c and the shield shell 20 can be reduced, and as compared to the case in which the shield shell 20 does not include the shell convex parts 24 and 25, the heat received by the heat conductive members 50 and 51 at the exposed surfaces 81c and 82c can be transmitted to the shield shell 20 quickly.

In the connector 1 according to the present embodiment, the heat conductive members 50 and 51 are thermosetting silicon, and fill between the exposed surfaces 81c and 82c and the top surfaces 24a and 25a of the shell convex parts 24 and 25 and additionally, fill the gap S formed between the inner peripheral surfaces 18b and 19b of the casing concave parts 18 and 19 and the outer peripheral surfaces 24b and 25b of the shell convex parts 24 and 25. In the case where the heat conductive members 50 and 51 are thermosetting silicon, the heat conductive members 50 and 51 are liquid before thermal hardening. Therefore, when the filling space parts 18c and 19c are filled with the liquid heat conductive members 50 and 51, the liquid heat conductive members 50 and 51 enter the gap S between the inner peripheral surfaces 18b and 19b of the casing concave parts 18 and 19 and the outer peripheral surfaces 24b and 25b of the shell convex parts 24 and 25. As a result, as compared to the conventional heat dissipation path with the atmosphere in the gap S to make the heat conduct from the heat conductive members 50 and 51 to the shield shell 20 through the atmosphere, the heat conduction from the heat conductive members 50 and 51 to the shield shell 20 can be improved.

Although a part of the stud bolts 81a and 82a is fixed to the housing 11 in the aforementioned embodiment, the embodiment is not limited to this example. Instead of a part of the stud bolts 81a and 82a, the nuts 81b and 82b may be fixed to the housing 11. In other words, the wire-side fastening mechanism 81 may include the nut 81b, which is a fixing member to be fixed to the housing 11, and the stud bolt 81a that is screwed with the nut 81b. The terminal-side fastening mechanism 82 may include the nut 82b, which is a fixing member to be fixed to the housing 11, and the stud bolt 82a that is screwed with the nut 82b. In this case, the nuts 81b and 82b are preferably cap nuts, for example. The stud bolts 81a and 82a are preferably ordinary bolts, for example.

In the above embodiment, the penetration holes 18a and 19a penetrate from the housing outer surface 11b to the housing inner surface 11c without sloping along the third direction as illustrated in FIG. 5; however, the embodiment is not limited to this example. In another example, the penetration holes 18a and 19a may penetrate from the housing outer surface 11b to the housing inner surface 11c, sloping from one side to the other side in the third direction. In this case, for example, the penetration holes 18a and 19a may have a shape whose cross section is tapered when viewed from a direction orthogonal to the third direction.

In the above embodiment, the heat conductive members 50 and 51 are thermosetting silicon, which is in a liquid state before thermal hardening; however, the material is not limited thereto. The heat conductive members 50 and 51 may be formed of any material with an insulating property and higher heat conductivity than the atmosphere (gas layer) and the material of the casing. The heat conductive members 50 and 51 are not limited to thermosetting silicon and may be solid silicon with elasticity, as long as it is possible to fill the filling space parts 18c and 19c.

The connector according to the present embodiment provides the effect that the heat generated in the blocking member can be easily released to the outside through the shield shell.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A connector comprising:
    a casing that has an insulating property and includes a casing space part;
    a shield shell that includes a shell space part for accommodating the casing;
    a wire that is partially arranged from outside the shield shell to the casing space part;
    a connector terminal that is accommodated in the casing space part, electrically connected to the wire in the casing space part, and electrically connected to a counterpart connector terminal in a counterpart connector;
    a blocking member that is electrically connected between the connector terminal and the wire in the casing space part and blocks current by overcurrent flowing in the wire;
    a fastening member and a fastened member that electrically connect the blocking member and the wire by bringing the blocking member and the wire in contact with each other in the casing space part; and
    a heat conductive member that is solid and has an insulating property, wherein
    the casing includes a concave part that is recessed from an outer surface of the casing toward the casing space part and that includes a filling space part to be internally filled with the heat conductive member,
    one of the fastening member and the fastened member is a fixing member that is fixed to the casing,
    the fixing member includes an exposed surface at least a part of which is exposed to the filling space part, and
    the heat conductive member is in direct contact with the exposed surface and an inner surface of the shield shell in a filled state in which the filling space part is filled with the heat conductive member.

2. The connector according to claim 1, wherein
    the shield shell includes a convex part that protrudes from the inner surface to the shell space part, and
    the heat conductive member is in direct contact with the convex part of the inner surface.

3. The connector according to claim 2, wherein
the heat conductive member is thermosetting silicon, fills
between the exposed surface and a top surface of the
convex part, and fills a gap formed between an inner
peripheral surface of the concave part and an outer
peripheral surface of the convex part.

* * * * *